United States Patent
Hayakawa et al.

(10) Patent No.: US 9,742,289 B2
(45) Date of Patent: Aug. 22, 2017

(54) INTEGRATED CIRCUIT AND SWITCHING POWER-SUPPLY DEVICE

(71) Applicant: Sanken Electric Co., LTD., Niiza-shi, Saitama (JP)

(72) Inventors: Akira Hayakawa, Niiza (JP); Mitsutomo Yoshinaga, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 63 days.

(21) Appl. No.: 14/746,956

(22) Filed: Jun. 23, 2015

(65) Prior Publication Data

US 2016/0380527 A1   Dec. 29, 2016

(51) Int. Cl.
*H02M 3/335*   (2006.01)
*H03K 17/16*   (2006.01)
*H02M 1/00*   (2006.01)

(52) U.S. Cl.
CPC ...... *H02M 3/33507* (2013.01); *H03K 17/166* (2013.01); *H02M 2001/0029* (2013.01); *H02M 2001/0054* (2013.01)

(58) Field of Classification Search
CPC . H02M 2001/0032; H02M 2001/0029; H02M 3/335
See application file for complete search history.

(56) References Cited

U.S. PATENT DOCUMENTS

| | | | |
|---|---|---|---|
| 2008/0209236 A1* | 8/2008 | Shaver | G06F 1/26 713/300 |
| 2010/0148737 A1* | 6/2010 | Li | H02M 3/1588 323/282 |
| 2011/0018515 A1* | 1/2011 | McCloy-Stevens | H02M 3/1588 323/284 |
| 2011/0057637 A1* | 3/2011 | Liu | H02M 3/156 323/287 |
| 2014/0021933 A1* | 1/2014 | Gladish | H02M 1/08 323/311 |
| 2014/0078790 A1 | 3/2014 | Lin et al. | |
| 2014/0368174 A1* | 12/2014 | Houston | H02M 3/158 323/271 |
| 2015/0097544 A1* | 4/2015 | Bizjak | H02M 3/156 323/284 |
| 2015/0138844 A1* | 5/2015 | Karlsson | H02M 3/158 363/21.1 |
| 2016/0181929 A1* | 6/2016 | Chen | G01R 19/15 363/21.18 |

* cited by examiner

*Primary Examiner* — Harry Behm
(74) *Attorney, Agent, or Firm* — Banner & Witcoff, Ltd.

(57) ABSTRACT

A switching power-supply device has an inductor, a switching element serially connected to the inductor, a control circuit, which controls on and off of the switching element and performs an output voltage control in any one of a plurality of modes including a continuous mode and a discontinuous mode, and a continuous mode detection circuit, which detects that the output voltage control is performed in the continuous mode when a current flowing through the switching element is equal to or greater than a threshold.

7 Claims, 9 Drawing Sheets

INTEGRATED CIRCUIT AND SWITCHING POWER-SUPPLY DEVICE

TECHNICAL FIELD

The disclosure relates to a switching power-supply device configured to perform an output voltage control by a switching operation, and an integrated circuit used for the same.

BACKGROUND ART

In a switching power-supply device configured to perform an output voltage control by a switching operation of a switching element connected to an inductor, a discontinuous mode, where the switching element is turned off and is then turned on after the current flowing through the inductor becomes zero, and a continuous mode, where the switching element is turned off and is then turned on before discharging of the accumulated energy of the inductor is completed and thus the current is enabled to continuously flow through the inductor are switched, depending on an input voltage and a state of load.

SUMMARY

As described above, according to the configuration where the continuous mode and the discontinuous mode are switched, the switching power-supply device may operate in the continuous mode even in a case where it is intended to operate the switching power-supply device in the discontinuous mode. As a result, a switching loss or a switching noise increases, so that EMI (Electro Magnetic Interference) may be deteriorated.

With consideration above, an object of the disclosure is to provide a switching power-supply device and an integrated circuit for the switching power-supply device capable of suppressing an increase in a switching loss or a switching noise even in a case where an operation is performed in a continuous mode.

A integrated circuit of this disclosure is an integrated circuit to be used in a switching power-supply device having an inductor and a switching element serially connected to the inductor, the integrated circuit comprising: a control circuit, which controls on and off of the switching element and performs an output voltage control in any one of a plurality of modes comprising a continuous mode and a discontinuous mode, and a continuous mode detection circuit, which detects that the output voltage control is performed in the continuous mode when a current flowing through the switching element is equal to or greater than a threshold.

According to the disclosure, it is possible to provide the switching power-supply device and the integrated circuit for the switching power-supply device capable of suppressing the increase in the switching loss or the switching noise even in a case where the operation is performed in the continuous mode.

DETAILED DESCRIPTION

Hereinafter, illustrative embodiments of the disclosure will be described with reference to the drawings.

Figure 1:
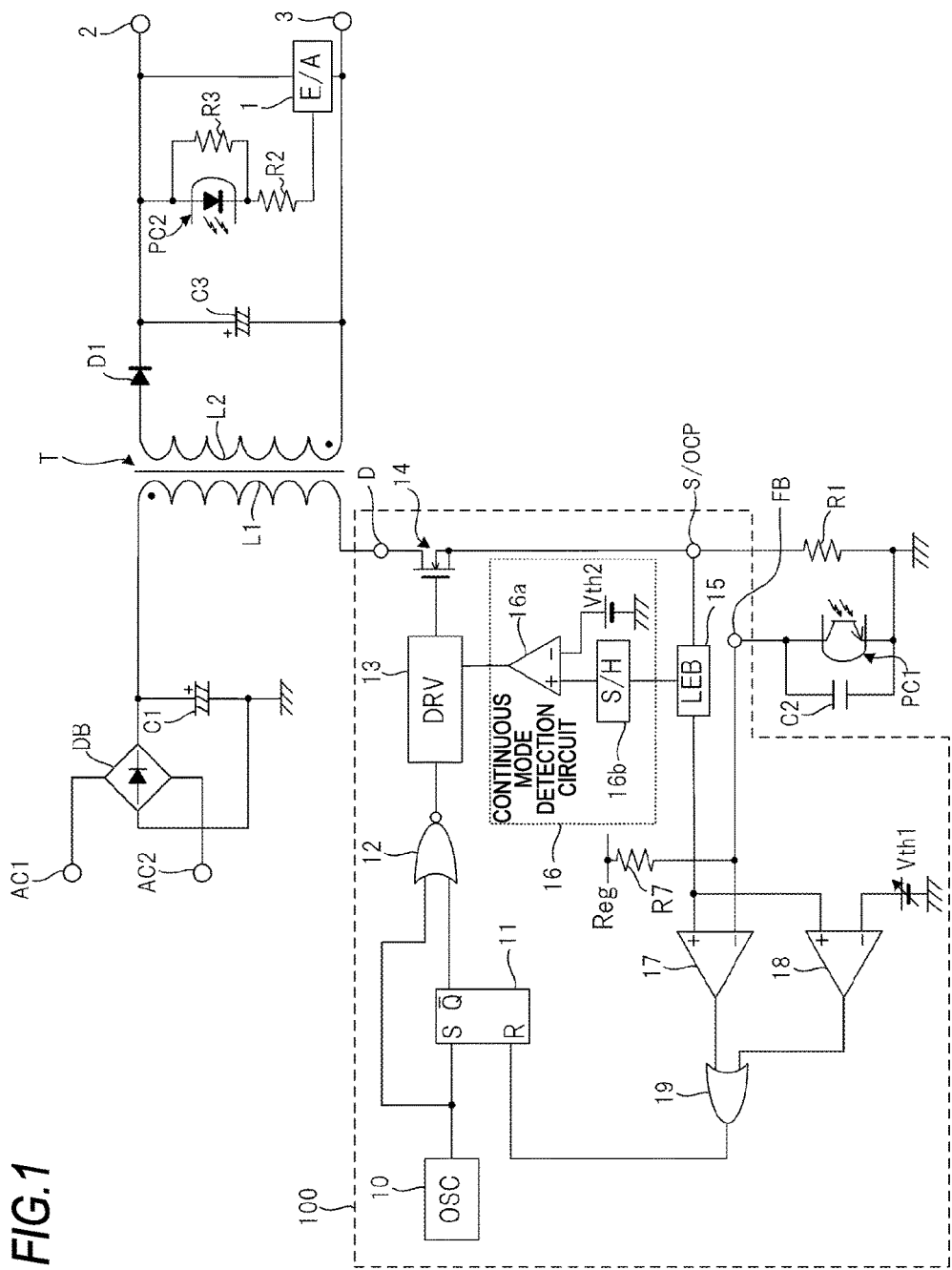
FIG. 1 is a circuit diagram of a switching power-supply device of an illustrative embodiment of the disclosure.

FIG. 1 is a circuit diagram showing an internal configuration of a switching power-supply device of an illustrative embodiment of the disclosure.

In FIG. 1, a primary-side circuit of the switching power-supply device has a rectification circuit DB, capacitors C1, C2, a primary winding L1 (an inductor) configuring a transformer T, a controller IC 100 which is a control circuit, a current detection resistance R1, and a light receiving transistor PC1 configuring a photo-coupler. The controller IC 100 configures an integrated circuit.

In FIG. 1, a secondary-side circuit of the switching power-supply device has a secondary winding L2 magnetically coupled to the primary winding L1 and configuring the transformer T, a diode D1 and a smoothing capacitor C3 configuring a rectification smoothing circuit configured to rectify and smooth an output voltage of the secondary winding L2, a light emitting diode PC2 configuring the photo-coupler, resistances R2, R3, and an error amplifier (E/A) 1.

Two output terminals of the secondary-side circuit include a ground-side output terminal 3 connected to a ground and a non-ground-side output terminal 2 not connected to the ground.

A commercial alternating current power source is connected to alternating current input terminals AC1, AC2 of the rectification circuit DB in which a diode is bridged. An alternating current voltage input from the commercial alternating current power source is full wave-rectified and is output from the rectification circuit DB.

The capacitor C1 is connected between a rectified output positive terminal and a rectified output negative terminal of the rectification circuit DB. Also, the rectified output negative terminal of the rectification circuit DB is grounded. Thereby, a direct current voltage is obtained by rectifying and smoothing an alternating current voltage supplied from the commercial alternating current power source at the rectification circuit DB and the capacitor C1.

The controller IC 100 includes a switching element 14 such as a power MOSFET (Metal Oxide Semiconductor Field Effect Transistor), and performs (switching control) on-and-off control of the switching element 14, thereby controlling a voltage to be output from the secondary-side circuit.

The controller IC 100 has a D (MOSFET drain) terminal connected to a drain of the switching element 14, an S/OCP (MOSFET source/overcurrent protection) terminal connected to a source of the switching element 14, and an FB (feedback signal input) terminal.

The transformer T configured to feed power from the primary-side circuit to the secondary-side circuit has the primary winding L1, and the secondary winding L2 magnetically coupled to the primary winding L1.

The rectified output positive terminal of the rectification circuit DB is connected to one end of the primary winding L1 of the transformer T, and the other end of the primary winding L1 of the transformer T is connected to the D terminal of the controller IC 100. The S/OCP terminal of the controller IC 100 is grounded via the current detection resistance R1.

The current detection resistance R1 is a current detection circuit configured to detect the drain current flowing through the switching element 14. A voltage generated at the S/OCP terminal of the controller IC 100 by the current detection resistance R1 is input to the controller IC 100, as a drain current detection signal Id of the switching element 14.

The light receiving transistor PC1 configuring the photo-coupler and the capacitor C2 are connected in parallel, between the FB terminal of the controller IC 100 and the ground. The light receiving transistor PC1 is configured to convert light received from the light emitting diode PC2 of the secondary-side circuit into an electric signal. The FB terminal is input with a feedback signal $V_{FB}$ transferred from the secondary-side circuit through the photo-coupler.

The diode D1 of the secondary-side circuit is connected between the secondary winding L2 and the non-ground-side output terminal 2.

In the smoothing capacitor C3 of the secondary-side circuit, a positive terminal is connected to a connection point of a cathode of the diode D1 and the non-ground-side output terminal 2 and a negative terminal is connected to the ground-side output terminal 3.

A voltage that is induced to the secondary winding L2 of the transformer T is rectified and smoothed by the diode D1 and the smoothing capacitor C3, and a voltage between the terminals of the smoothing capacitor C3 is output from the output terminal, as an output voltage Vo. In the meantime, a line connected to the positive terminal of the smoothing capacitor C3 is a power supply line, and a line connected with the negative terminal of the smoothing capacitor C3 is a GND line.

The error amplifier 1 is connected between the power supply line and the GND line. The error amplifier 1 is configured to control the current flowing through the light emitting diode PC2 of the photo-coupler in accordance with a difference between the output voltage Vo and a reference voltage Vref.

Thereby, a feedback signal corresponding to the output voltage Vo is transmitted from the light emitting diode PC2 to the light receiving transistor PC1 of the primary-side circuit, and is input to the FB terminal of the controller IC 100, as the feedback signal $V_{FB}$.

In addition to the switching element 14, the controller IC 100 further has an oscillator (OSC) 10, an RS flip-flop (RS-FF) 11, a NOR circuit 12, a driving circuit (DRV) 13, a leading edge blanking (LEB) circuit 15, a continuous mode detection circuit 16, comparators 17, 18, an OR circuit 19, and a resistance R7 connected to a regulator Reg.

The LEB circuit 15 is connected to the S/OCP terminal, and is a circuit configured to invalidate (blanking) a signal in a time period, during which a surge current flows through the switching element 14 upon the turn-on of the switching element 14, of the drain current detection signal Id to be input from the S/OCP terminal. The drain current detection signal Id output from the LEB circuit 15 is input to the continuous mode detection circuit 16, the comparator 17 and the comparator 18, respectively.

In the comparator 17, drain current detection signal Id is input to a non-inverting input terminal from the LEB circuit 15 and the feedback signal $V_{FB}$ is input to an inverting input terminal from the FB terminal. The comparator 17 outputs a high-level signal when the drain current detection signal Id input to the non-inverting input terminal is equal to or greater than the feedback signal $V_{FB}$ input to the inverting input terminal. The resistance R7 is connected between the inverting input terminal of the comparator 17 and the FB terminal.

In the comparator 18, an overcurrent threshold Vth1 is input to an inverting input terminal and the drain current detection signal Id is input to a non-inverting input terminal from the LEB circuit 15. The comparator 18 compares the drain current detection signal Id input from the LEB circuit 15 and the overcurrent threshold Vth1, and outputs a high-level signal when the drain current detection signal Id is equal to or greater than the overcurrent threshold Vth1.

In the OR circuit 19, the output signal of the comparator 17 and the output signal of the comparator 18 are input thereto. The OR circuit 19 outputs a high-level signal when the high-level signal is input thereto from any one of the comparator 17 and the comparator 18.

In the RS-FF 11, a pulse signal having a predetermined frequency, which is supplied from the OSC 10, is input to a set terminal S and the output signal of the OR circuit 19 is input to a reset terminal R.

In the NOR circuit 12, a signal output from an inverting output terminal Q⁻ of the RS-FF 11 and the pulse signal having a predetermined frequency, which is supplied from the OSC 10, are input thereto. An output signal of the NOR circuit 12 is input to the DRV 13.

The DRV 13 performs on-and-off control of the switching element 14 with a predetermined switching frequency, depending on the pulse signal generated from the OSC 10 and the output signal of the RS-FF 11.

A reset timing of the RS-FF 11 is determined by the output signal of the comparator 17. That is, the controller IC 100 performs PWM control of controlling a width of an on time period of the switching element 14 so that the voltage output from the secondary-side circuit becomes the reference voltage Vref.

The controller IC 100 performs an output voltage control in any one of a plurality of modes including a discontinuous mode where the switching element 14 is turned off and is then turned on after the current flowing through the inductor L2 becomes zero and a continuous mode where the switching element 14 is turned off and is then turned on before the current flowing through the inductor L2 becomes zero and thus the current is enabled to continuously flow through the inductor L1.

In the meantime, the plurality of modes also includes a critical mode where the switching element 14 is turned off and is then turned on at a timing where the current flowing through the inductor L2 becomes zero. The controller IC 100 performs the output voltage control in the discontinuous mode when a load is a light load and performs the output voltage control in the continuous mode when the load is equal to or greater than an intermediate load.

The continuous mode detection circuit 16 is configured to detect whether the output voltage control is performed in the continuous mode and has a comparator 16a and a sample hold circuit (S/H) 16b.

The S/H 16b is a circuit configured to sample the drain current detection signal Id at a predetermined timing and to hold the sampled signal. The timing is a timing where the switching element 14 is turned on and the flowing of the surge current through the switching element 14 is over. The S/H 16b is configured to determine the turn-on timing of the switching element 14 in accordance with the output signal of the NOR circuit 12.

To the S/H 16b, the drain current detection signal Id is input from the LEB circuit 15. When the switching element 14 is turned on, the drain current detection signal Id is not input to the S/H 16b in a time period until the flowing of the surge current is over, and after the time period elapses, the drain current detection signal Id is input to the S/H 16b. The S/H 16b samples and holds the drain current detection signal Id at a timing where the time period elapses after the switching element 14 is turned on.

Figure 2:
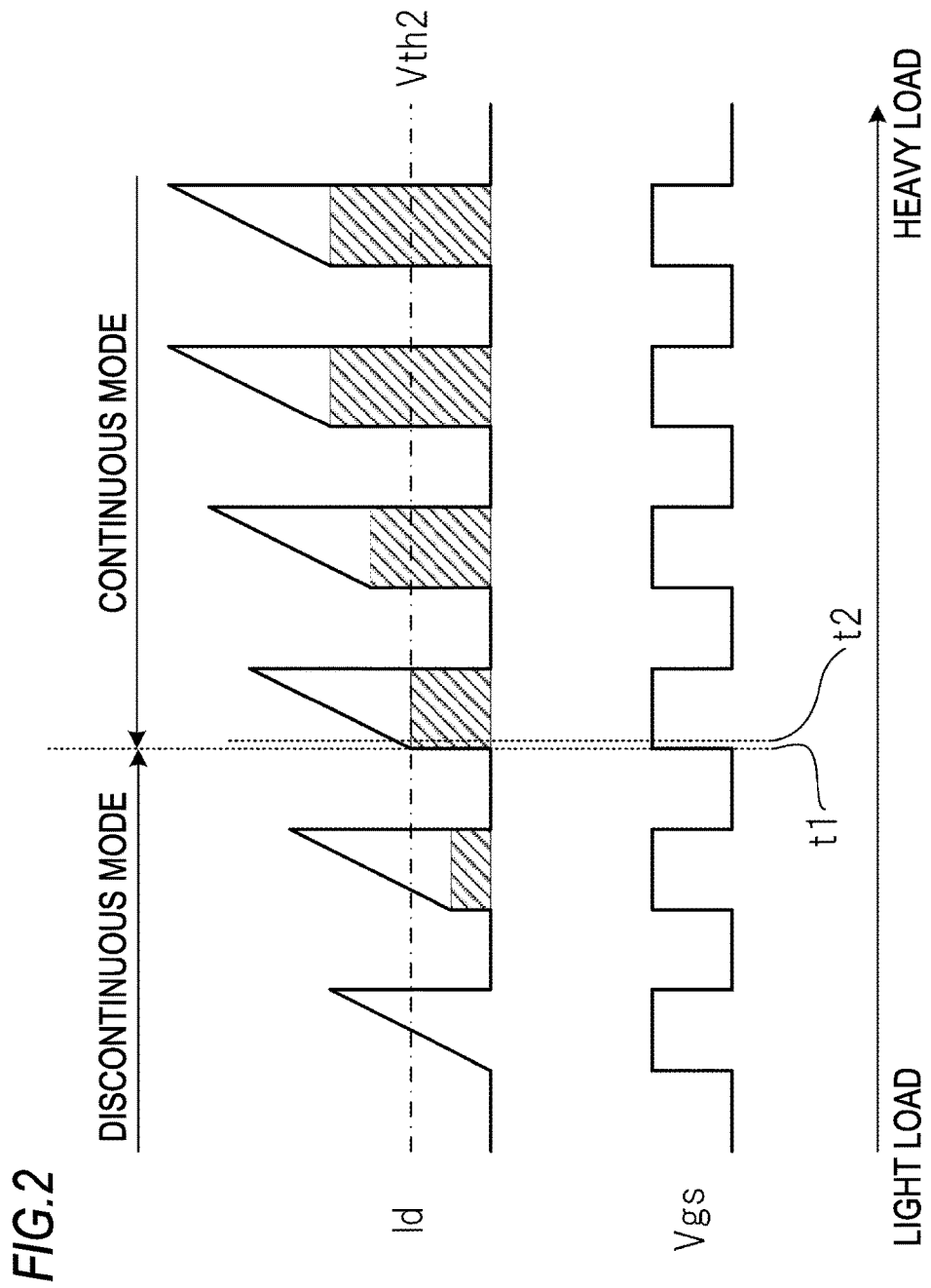
FIG. 2 illustrates a change in drain current of a switching element 14 of the switching power-supply device shown in FIG. 1.

FIG. 2 illustrates a change in the drain current detection signal Id when the operating mode of the switching power-supply device shown in FIG. 1 is switched from the discontinuous mode to the continuous mode. In FIG. 2, "Vgs" indicates a voltage between a gate and a source of the switching element 14. When the voltage is a high level, the switching element 14 becomes on, and when the voltage is a low level, the switching element 14 becomes off.

As shown in FIG. 2, when the operating mode is switched from the discontinuous mode to the continuous mode, the switching element 14 is turned on at a state where the energy of the inductor L1 is not completely discharged. Accordingly, a direct current component (refer to the diagonal lines) of the drain current detection signal Id overlaps with a waveform detected just before upon the turn-on of the switching element 14. When the overlapping direct current component is large, it can be determined that the operating mode is the continuous mode.

In the meantime, during a transition period from the discontinuous mode to the continuous mode, only the slight overlapping direct current may be included in the drain current detection signal Id. Therefore, a threshold Vth2 having a certain level of magnitude is set as a threshold of the drain current detection signal Id so as to determine the continuous mode.

The drain current detection signal Id becomes a large value due to an influence of the surge current just after the turn-on of the switching element 14 (a time period of time point t1 to t2), but returns to a value without the influence of the surge current after time point t2. That is, the continuous mode detection circuit 16 is configured to determine whether the operating mode is the continuous mode by determining whether a value of the drain current detection signal Id detected just after time point t2 is equal to or greater than the threshold Vth2.

Specifically, the S/H 16b is configured to sample and hold a value of the drain current detection signal Id detected just after time point t2. Then, the comparator 16a compares the value held by the S/H 16b and the threshold Vth2, and outputs a continuous mode detection signal (a high-level signal), which indicates the continuous mode, when the value held by the S/H 16b is equal to or greater than the threshold. When the value held by the S/H 16b is smaller than the threshold Vth2, the comparator 16a outputs a continuous mode non-detection signal (a low-level signal), which indicates that the operating mode is not the continuous mode.

In the meantime, the threshold Vth2 is experimentally determined by actually measuring the drain current detection signal Id upon the operation of the switching power-supply device in the continuous mode.

The DRV 13 changes a drive speed of the switching element 14 when it is detected that the output voltage control is performed in the continuous mode (when the continuous mode detection signal is input) and when it is not detected that the output voltage control is performed in the continuous mode (when the continuous mode non-detection signal is input). The drive speed of the switching element 14 indicates a time required until a gate (or base) voltage of the switching element 14 reaches a peak value.

Specifically, when the continuous mode detection signal is received from the comparator 16a, the DRV 13 makes the drive speed of the switching element 14 faster than the drive speed of the switching element 14 when the continuous mode detection signal is not received.

When the DRV 13 receives the continuous mode detection signal, the switching element 14 is at the on state. The drive speed of the switching element 14 at a time point where the continuous mode detection signal is received is denoted with Dr1 and the drive speed of the switching element 14 after the continuous mode detection signal is received is denoted with Dr2. The DRV 13 controls so that Dr1<Dr2.

Figure 3:
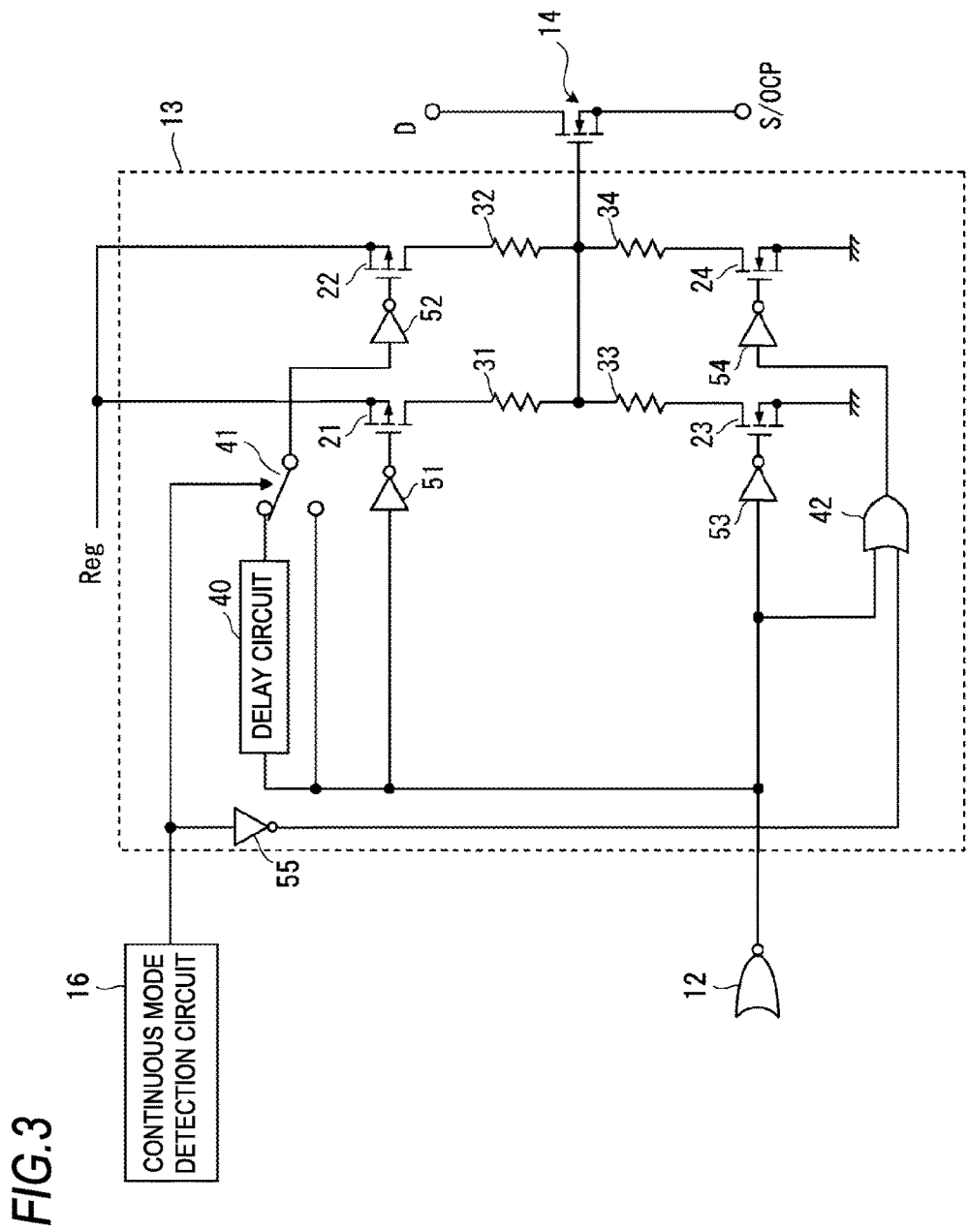
FIG. 3 is a circuit diagram showing an internal configuration of a DRV 13 of the switching power-supply device shown in FIG. 1.

FIG. 3 is a circuit diagram showing an example of the internal configuration of the DRV 13 of the switching power-supply device shown in FIG. 1.

The DRV 13 has a first switch element 21 for on consisting of a P channel-type MOSFET, a second switch element 22 for on consisting of a P channel-type MOSFET, a first on-drive resistance 31, a second on-drive resistance 32, a first switch element 23 for off consisting of an N channel-type MOSFET, a second switch element 24 for off consisting of an N channel-type MOSFET, a first off-drive resistance 33, a second off-drive resistance 34, a delay circuit 40, a changeover switch 41, an OR circuit 42, inverters 51, 52, 53, 54, and a NOT circuit 55.

The first switch element 21 for on and the first on-drive resistance 31 connected in series and the second switch element 22 for on and the second on-drive resistance 32 connected in series are connected in parallel between the power supply voltage Reg and the gate of the switching element 14.

A gate of the first switch element 21 for on is connected with an output terminal of the NOR circuit 12 via the inverter 51. A gate of the second switch element 22 for on is connected with an output terminal of the changeover switch 41 via the inverter 52.

The output terminal of the NOR circuit 12 is directly connected to one input terminal of the changeover switch 41. The output terminal of the NOR circuit 12 is connected to the other input terminal of the changeover switch 41 via the delay circuit 40.

The first off-drive resistance 33 and the first switch element 23 for off connected in series and the second off-drive resistance 34 and the second switch element 24 for off connected in series are connected in parallel between the gate of the switching element 14 and the ground terminal.

A gate of the first switch element 23 for off is connected with the output terminal of the NOR circuit 12 through the inverter 53. A gate of the second switch element 24 for off is connected with the output terminal of the OR circuit 42 through the inverter 54.

The output terminal of the NOR circuit 12 is connected to one input terminal of the OR circuit 42. An output terminal of the NOT circuit 55 is connected to the other input terminal of the OR circuit 42. The input terminal of the NOT circuit 55 is connected to the output terminal of the continuous mode detection circuit 16.

The changeover switch 41 is controlled by the output signal of the continuous mode detection circuit 16. The changeover switch 41 is switched to an input terminal-side (a lower side in FIG. 3) directly connected to the output terminal of the NOR circuit 12 when the output signal of the continuous mode detection circuit 16 is a high level (the continuous mode), and is switched to an input terminal-side (an upper side in FIG. 3) connected to the delay circuit 40 when the output signal of the continuous mode detection circuit 16 is a low level (an operating mode other than the continuous mode).

At a state where the output signal of the continuous mode detection circuit 16 is the high level (the changeover switch 41 is switched to the lower side in FIG. 3), when the output signal of the NOR circuit 12 becomes a high level, the first switch element 21 for on and the second switch element 22 for on become on at the same time. Also, the first switch element 23 for off becomes off and the output of the OR circuit 42 becomes a high level, so that the second switch element 24 for off becomes off. Thereby, the gate of the switching element 14 is charged through the first on-drive resistance 31 and the second on-drive resistance 32 connected in parallel, as shown in FIG. 4a.

At a state where the output signal of the continuous mode detection circuit 16 is the high level (the changeover switch 41 is switched to the lower side in FIG. 3), when the output signal of the NOR circuit 12 is inverted to a low level, both the first switch element 21 for on and the second switch element 22 for on become off. Also, the first switch element 23 for off becomes on and the output of the OR circuit 42 becomes a low level, so that the second switch element 24 for off becomes on. Thereby, as shown in FIG. 4a, the charges charged in the gate of the switching element 14 are discharged through the first off-drive resistance 33 and the second off-drive resistance 34 connected in parallel.

At a state where the output signal of the continuous mode detection circuit 16 is the low level (the changeover switch 41 is switched to the upper side in FIG. 3), the output signal of the NOR circuit 12 is input to the second switch element 22 for on through the delay circuit 40. The delay circuit 40 is a circuit configured to delay the rising of the output signal of the NOR circuit 12.

Figure 4:
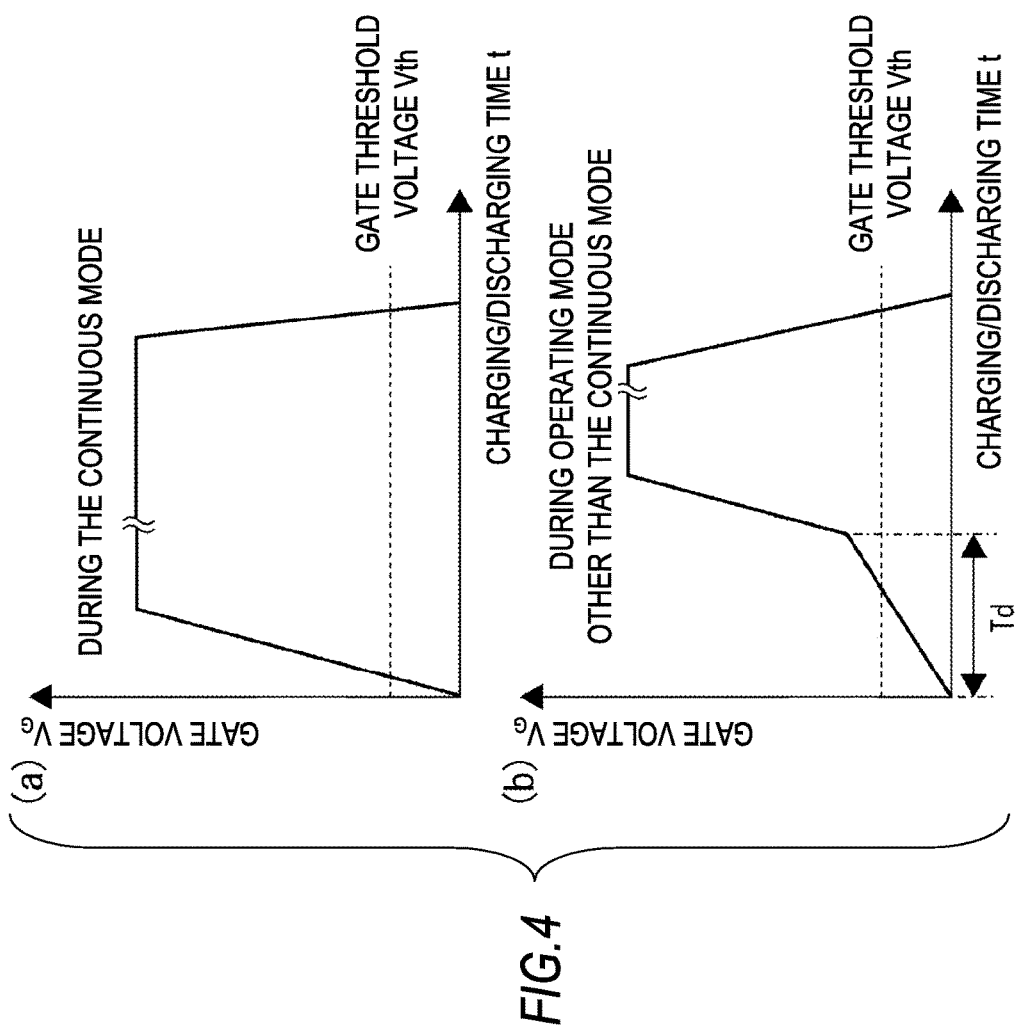
FIG. 4 illustrates a driving waveform of the switching element 14 by the DRV 13 shown in FIG. 3.

Therefore, when the output signal of the NOR circuit 12 becomes the high level, only the first switch element 21 for on first becomes on, and the gate of the switching element 14 is charged only through the first on-drive resistance 31, as shown in FIG. 4b. Then, after a delay time point td set for the delay circuit 40 elapses, the second switch element 22 for on becomes on, and the gate of the switching element 14 is charged through the first on-drive resistance 31 and the second on-drive resistance 32 connected in parallel. The delay time point td set for the delay circuit 40 is set as a time at which the gate the voltage $V_G$ of the switching element 14 charged through only the first on-drive resistance 31 exceeds the gate threshold voltage $V_{th}$, as shown in FIG. 4b.

On the other hand, at a state where the output signal of the continuous mode detection circuit 16 is the low level (the changeover switch 41 is switched to the upper side in FIG. 3), when the output signal of the NOR circuit 12 becomes the high level, the first switch element 23 for off becomes off and the output of the OR circuit 42 becomes the high level, so that the second switch element 24 for off becomes off.

Therefore, in an operating mode other than the continuous mode, a resistance value of the on-drive resistance is switched to a large value until the gate voltage $V_G$ passes the gate threshold voltage $V_{th}$, and the charging speed of the gate voltage $V_G$ and the drive speed become slow at a time point where the gate voltage $V_G$ passes the gate threshold voltage $V_{th}$.

At a state where the output signal of the continuous mode detection circuit 16 is the low level (the changeover switch 41 is switched to the upper side in FIG. 3), when the output signal of the NOR circuit 12 is switched to the low level, both the first switch element 21 for on and the second switch element 22 for on become off. Also, since the first switch element 23 for off becomes on and the output of the OR circuit 42 is kept at the high level, the second switch element 24 for off is kept at the off state.

Thereby, as shown in FIG. 4b, the charges charged in the gate of the switching element 14 are discharged through only the first off-drive resistance 33, and the discharging time is controlled to be longer, as compared to the continuous mode shown in FIG. 4a.

In this way, the DRV 13 controls the drive speed of the switching element 14 by changing the drive resistance value.

Subsequently, the operations of the switching power-supply device shown in FIG. 1 are described.

When the switching control of the switching element 14 by the controller IC 100 starts and the switching element 14 is turned on, the drain current flowing through the switching element 14 is input to the LEB circuit 15, as the drain current detection signal Id. The LEB circuit 15 inputs a signal of the drain current detection signal Id, which is a signal after the time period for which the surge current flows through the switching element 14, to the S/H 16b.

The S/H 16b samples and holds the drain current detection signal Id input from the LEB circuit 15 after the switching element 14 is turned on. The comparator 16a compares the drain current detection signal Id held at the S/H 16b and the threshold Vth2, and outputs the high-level signal when the drain current detection signal Id is equal to or greater than the threshold Vth2, and outputs the low-level signal when the drain current detection signal Id is smaller than the threshold Vth2.

At a state where the low-level signal is input from the comparator 16a, the DRV 13 switches the changeover switch 41 to the delay circuit 40-side to set the drive speed of the switching element 14 to Dr1 (a first value). On the other hand, at a state where the high-level signal is input from the comparator 16a, the DRV 13 switches the changeover switch 41 to an opposite side to the delay circuit 40-side to set the drive speed of the switching element 14 to Dr2 (a second value) faster than Dr1.

In this way, during the continuous mode, the drive speed is made to be faster, as compared to the operating mode other than the continuous mode, so that it is possible to reduce a switching loss during the continuous mode and to suppress the heat generation of the controller IC 100.

The DRV 13 is configured to switch the drive speed of the switching element 14 to the two values of Dr1 and Dr2. However, it is also possible to set three or more drive speeds.

In this case, in a time period for which the low-level signal is output from the continuous mode detection circuit 16, the DRV 13 sets the drive speed to be Dr1, and in a time period for which the high-level signal is output from the continuous mode detection circuit 16, the DRV 13 selects and sets a value corresponding to a magnitude of the signal level kept by the S/H 16b from a plurality of values faster than Dr1, as regards the drive speed. Specifically, the DRV 13 is configured to set the faster drive speed when the signal level held by the S/H 16*b* is larger. In this way, it is possible to perform the fine control in response to the situations.

Also, when the high-level signal is output from the continuous mode detection circuit 16, the DRV 13 may slow down the drive speed, as compared to Dr1, instead of making the drive speed faster than Dr1. In this way, it is possible to suppress the EMI noise or to suppress a VRM surge voltage of the diode D1 of the secondary-side circuit.

Also, while the power supply is being off, when the high-level signal is output from the continuous mode detection circuit 16 and when an on duty (a ratio of the on-time period of the switching element 14 to a switching cycle) of the switching element 14 exceeds a predetermined value (for example, 50%), the DRV 13 may set the drive speed to be Dr1. Thereby, when the power supply is off, it is possible to suppress the transient VRM surge voltage of the diode D1 of the secondary-side circuit. In this modified embodiment, the controller IC 1 may further have a circuit configured to detect the on duty of the switching element 14, and an output signal of the circuit may be input to the DRV 13.

Figure 5:
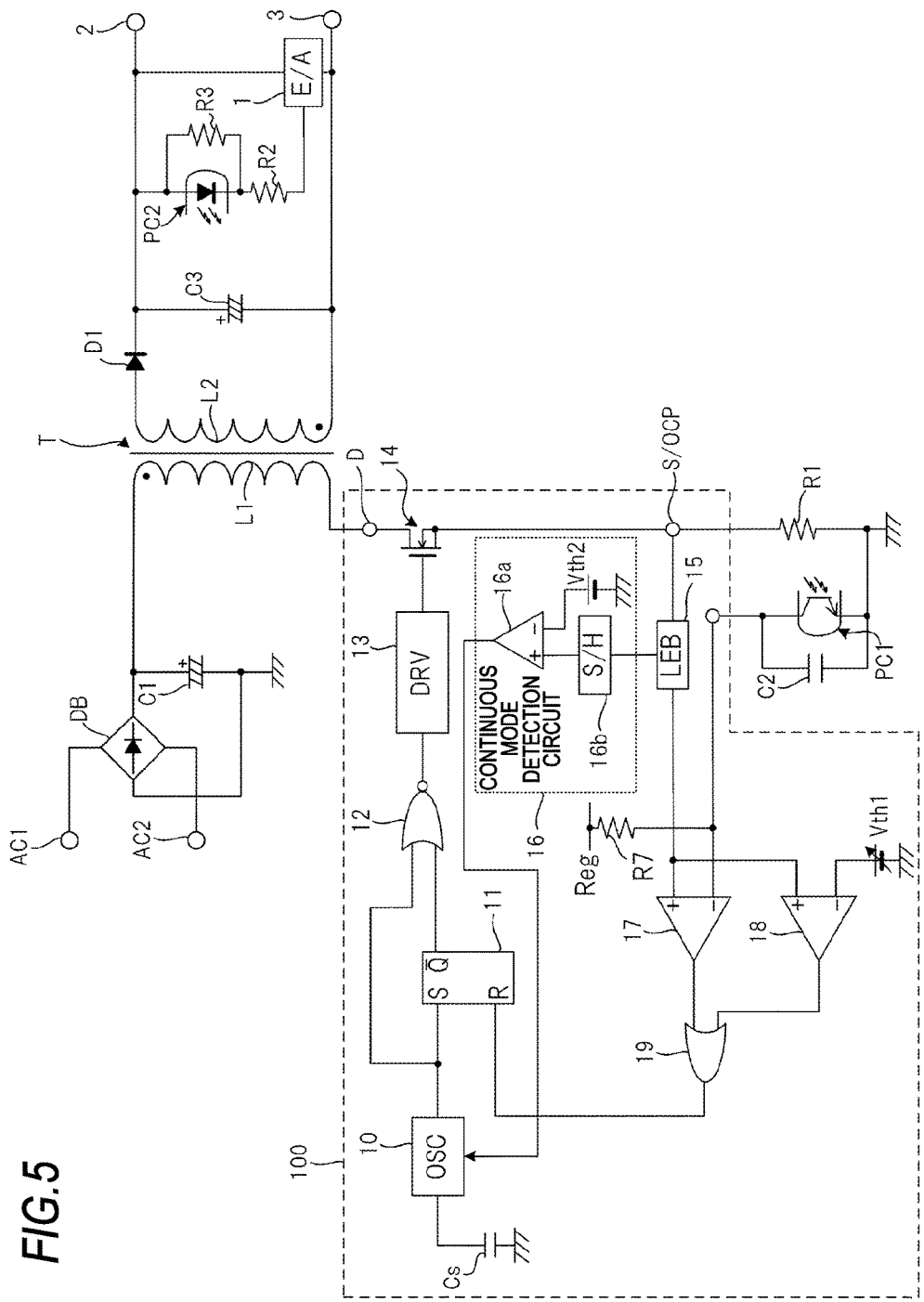
FIG. 5 shows a first modified embodiment of the switching power-supply device shown in FIG. 1.

FIG. 5 shows a first modified embodiment of the switching power-supply device shown in FIG. 1.

The switching power-supply device show in FIG. 5 has the same configuration as the switching power-supply device shown in FIG. 1, except that the configurations of the OSC 10 and the DRV 13 are partially changed and the output of the comparator 16*a* is input to the OSC 10.

The OSC 10 of the switching power-supply device shown in FIG. 5 is configured to control charging and discharging timings of a capacitor Cs, thereby varying an oscillation frequency. The DRV 13 of the switching power-supply device shown in FIG. 5 is a general driving circuit of which the drive speed is fixed.

In the switching power-supply device shown in FIG. 5, the controller IC 100 changes the switching frequency of the switching element 14 when it is detected that the output voltage control is performed in the continuous mode and a case where it is not detected that the output voltage control is performed in the continuous mode.

Specifically, the controller IC 100 can switch the switching frequency of the switching element 14 to a plurality of values including a third value and a fourth value smaller than the third value. The controller IC 100 controls the switching frequency to be the fourth value when it is detected that the output voltage control is performed in the continuous mode and controls the switching frequency to be the third value when it is not detected that the output voltage control is performed in the continuous mode.

In the switching power-supply device of FIG. 5, when the output of the comparator 16*a* becomes a high level, an output of one-shot circuit embedded in the OSC 10 becomes a high level for a predetermined time period by the rising of the high-level signal, and the capacitor Cs is discharged for the predetermined time period. The predetermined time period is set to be longer than a discharging time during an operating mode other than the continuous mode of the capacitor Cs.

Figure 6:
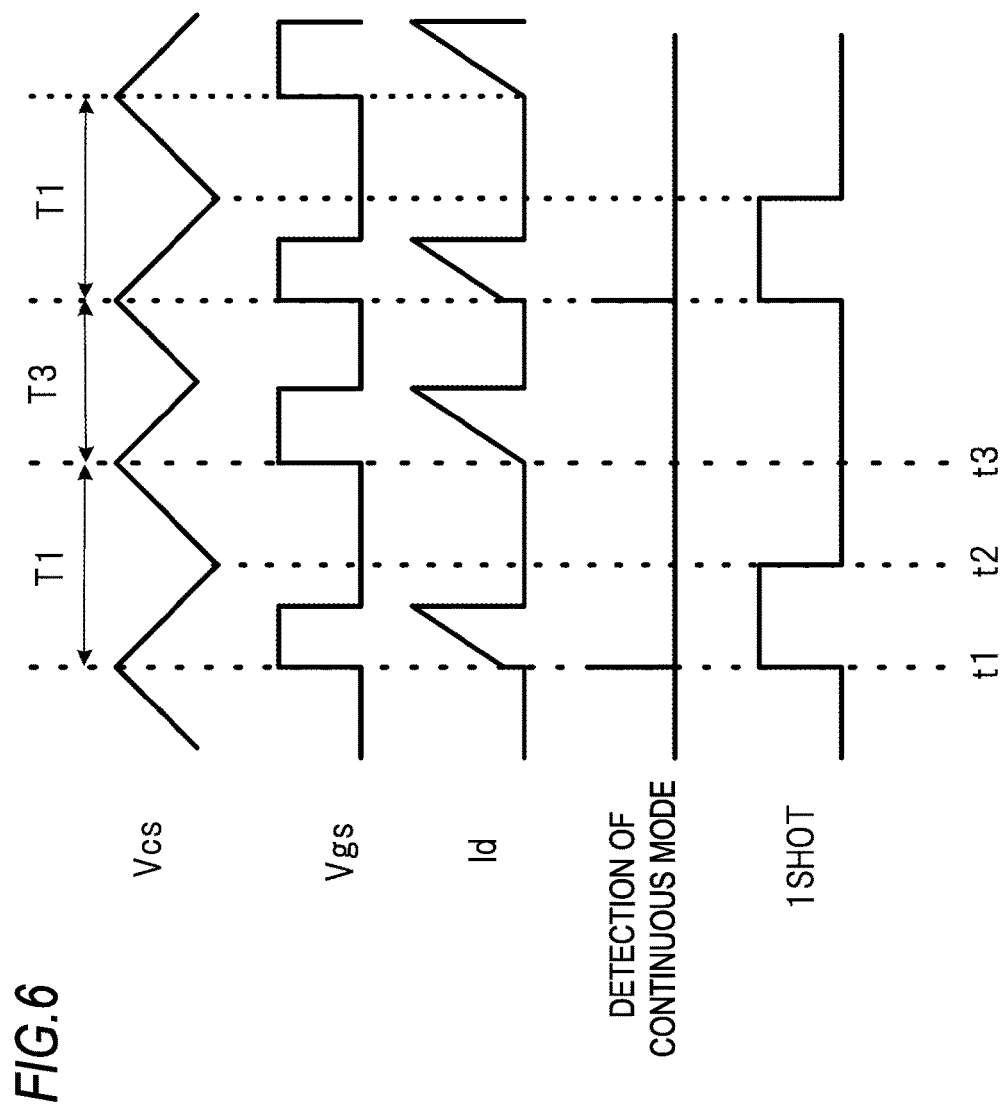
FIG. 6 is a timing chart for illustrating operations of the switching power-supply device shown in FIG. 5.

FIG. 6 is a timing chart for illustrating the operations of the switching power-supply device shown in FIG. 5. In FIG. 6, "Vcs" indicates a voltage of the capacitor Cs. "1SHOT" indicates a waveform of the one-shot circuit embedded in the OSC 10

As shown in FIG. 6, when a voltage of the capacitor Cs reaches a peak at time point t1, the output signal of the OSC 10 becomes a high level and the switching element 14 is turned on. At this state, when the continuous mode detection signal is input to the OSC 10, the output of the one-shot circuit becomes a high level in synchronization with the rising of the continuous mode detection signal, and the discharging of capacitor Cs starts. Then, at time point t2, when the output of the one-shot circuit returns to the low level, the discharging of the capacitor Cs is over and the charging starts. After that, at time point t3, when the voltage of the capacitor Cs reaches the peak, the output signal of the OSC 10 becomes the high level and the switching element 14 is turned on.

In FIG. 6, a time period T1, which is a sum of a discharging time period (time point t1 to t2) in accordance with the output of the one-shot circuit and a charging time period (time point t2 to t3) thereafter, is set to be longer than a time period T3, which is a sum of a discharging time period of the capacitor Cs irrelevant to the output of the one-shot circuit and a charging time period thereafter.

In this way, when the continuous mode detection signal is output from the comparator 16*a*, the controller IC 100 lowers the switching frequency of the switching element 14, as compared to a case where the continuous mode detection signal is not output from the comparator 16*a*.

By the above frequency control, it is possible to turn on the switching element 14 at the ending timing of the time period T1 at a state where the current flowing through the inductor L2 is sufficiently reduced. Accordingly, it is possible to reduce the switching loss and to suppress the heat generation of the controller IC 100. Also, it is possible to reduce the switching noise and the EMI noise. Also, it is possible to suppress the heat generation of the diode D2 of the secondary-side circuit and to protect the circuit.

Figure 7:
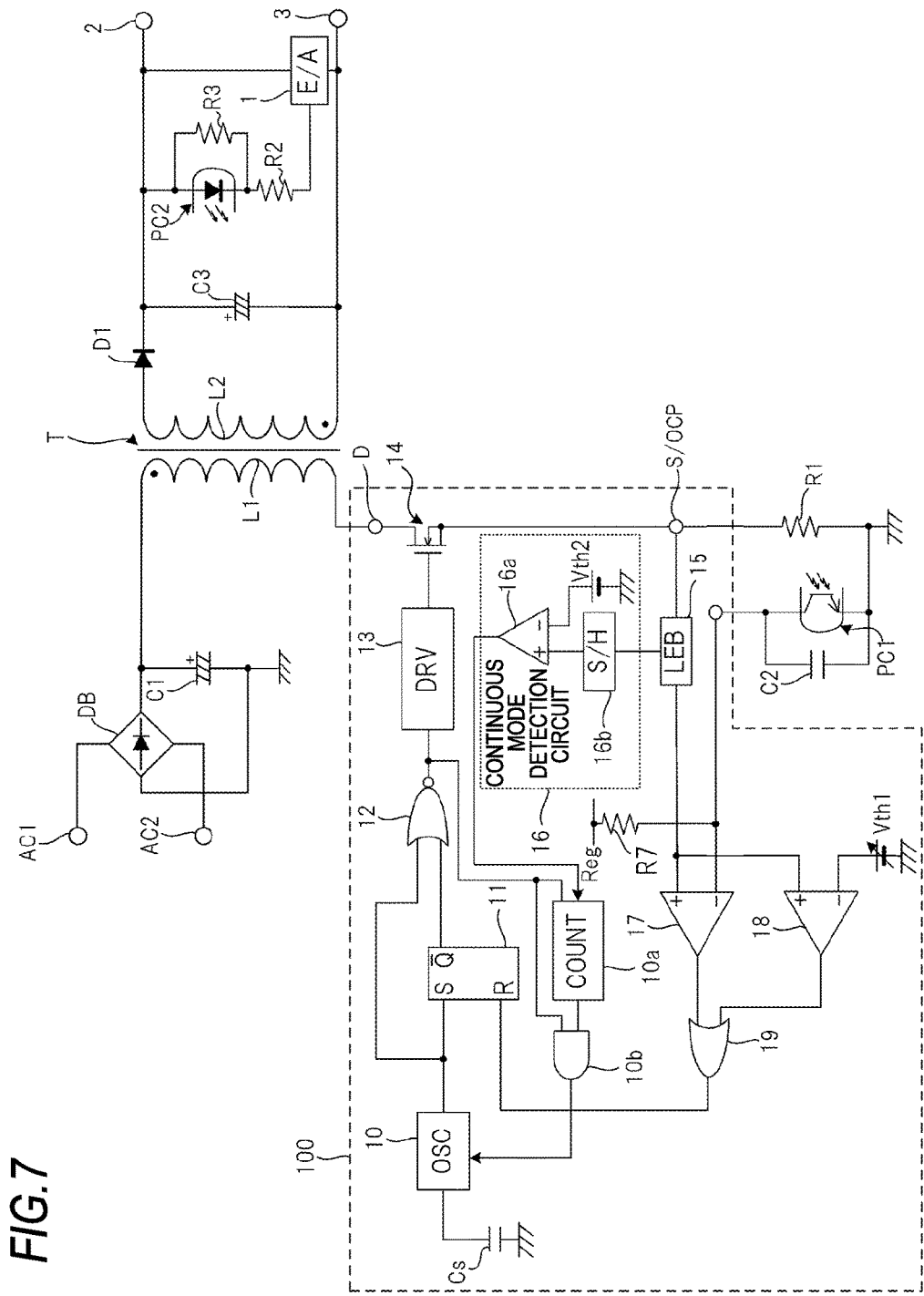
FIG. 7 shows a second modified embodiment of the switching power-supply device shown in FIG. 1.

FIG. 7 shows a second modified embodiment of the switching power-supply device shown in FIG. 1. The switching power-supply device shows in FIG. 7 has the same configuration as the switching power-supply device shown in FIG. 5, except that a counter 10*a* and an AND circuit 10*b* are added.

To the counter 10*a*, the output signal of the comparator 16*a* and the output signal of the NOR circuit 12 are input. When the output signal of the comparator 16*a* becomes a high level, the counter 10*a* counts a time until two switching cycles of the switching element 14 elapse in accordance with the output signal of the NOR circuit 12 and outputs a high-level signal during the count time period.

To the AND circuit 10*b*, the output signal of the counter 10*a* and the output signal of the NOR circuit 12 are input. The AND circuit 10*b* is configured to output a pulse signal in synchronization with the rising of the output signal of the NOR circuit 12 during a time period for which the output signal of the counter 10*a* is the high level.

The OSC 10 has the one-shot circuit embedded therein. The one-shot circuit outputs a pulse signal of a predetermined width to control the discharging of the capacitor Cs in synchronization with the rising of the pulse signal input from the AND circuit 10*b*. Thereby, the OSC 10 can vary the oscillation frequency.

Figure 8:
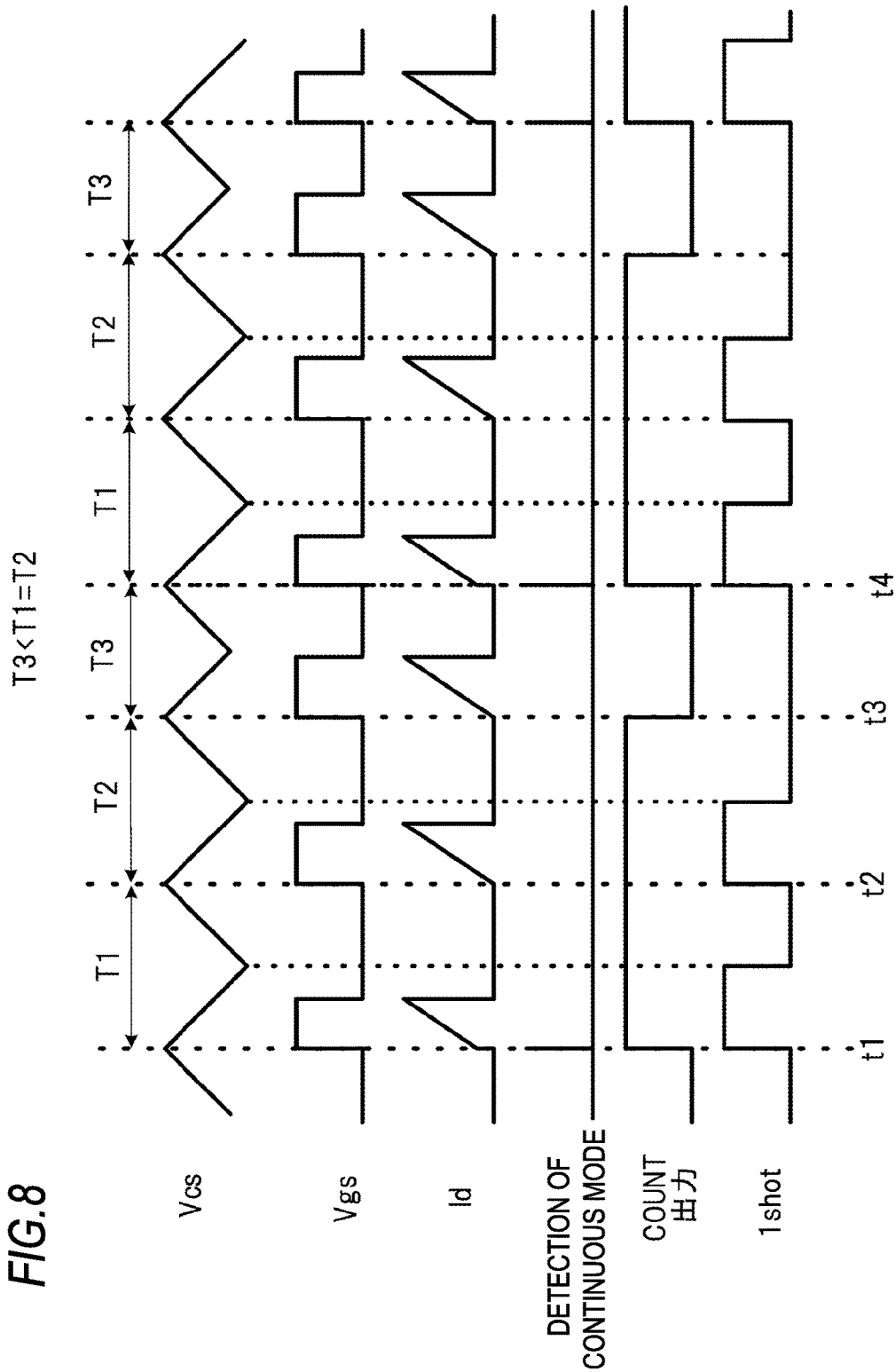
FIG. 8 is a timing chart for illustrating operations of the switching power-supply device shown in FIG. 7.

FIG. 8 is a timing chart for illustrating operations of the switching power-supply device shown in FIG. 7.

At time point t1, when the continuous mode detection signal is output from the comparator 16*a*, the output of the counter 10*a* becomes the high level. The output of the counter 10*a* is being the high level up to time point t3.

During time points t1 to t3, the AND circuit 10*b* outputs the pulse signals at the rising timings (times t1 and t2) of the output (which is the same meaning as Vgs) of the NOR circuit 12. By the respective pulse signals, the capacitor Cs is discharged by the one-shot circuit, and the switching frequency is controlled to be low.

When the output of the counter 10a becomes the low level at time point t3, the pulse signal is not output from the AND circuit 10b, irrespective of the output of the NOR circuit 12. Thereby, the switching cycle returns to the original cycle.

In the example of FIG. 8, a relation among a time period T1 from time point t1 to time point t2, a time period T2 from time point t2 to time point t3 and a time period T3 from time point t3 to time point t4 is set to be T1=T2>T3.

In this way, when it is detected that the output voltage control is performed in the continuous mode, the controller IC 100 of the switching power-supply device shown in FIG. 7 controls the switching frequency of the switching element 14 to the fourth value (1/T1) during the time period, which corresponds to the two cycles from the point of detection time, and controls the switching frequency to be the third value (1/T3) after the time period elapses from the point of detection time. In the meantime, the time period is here set to the two cycles but may be three or more cycles.

According to the switching power-supply device of FIG. 7, it is possible to turn on the switching element 14 at a state where the overlapping direct current of the drain current detection signal Id upon the turn-on of the switching element 14 is reduced as much as possible. Accordingly, it is possible to increase the effect of reducing the switching loss.

Figure 9:
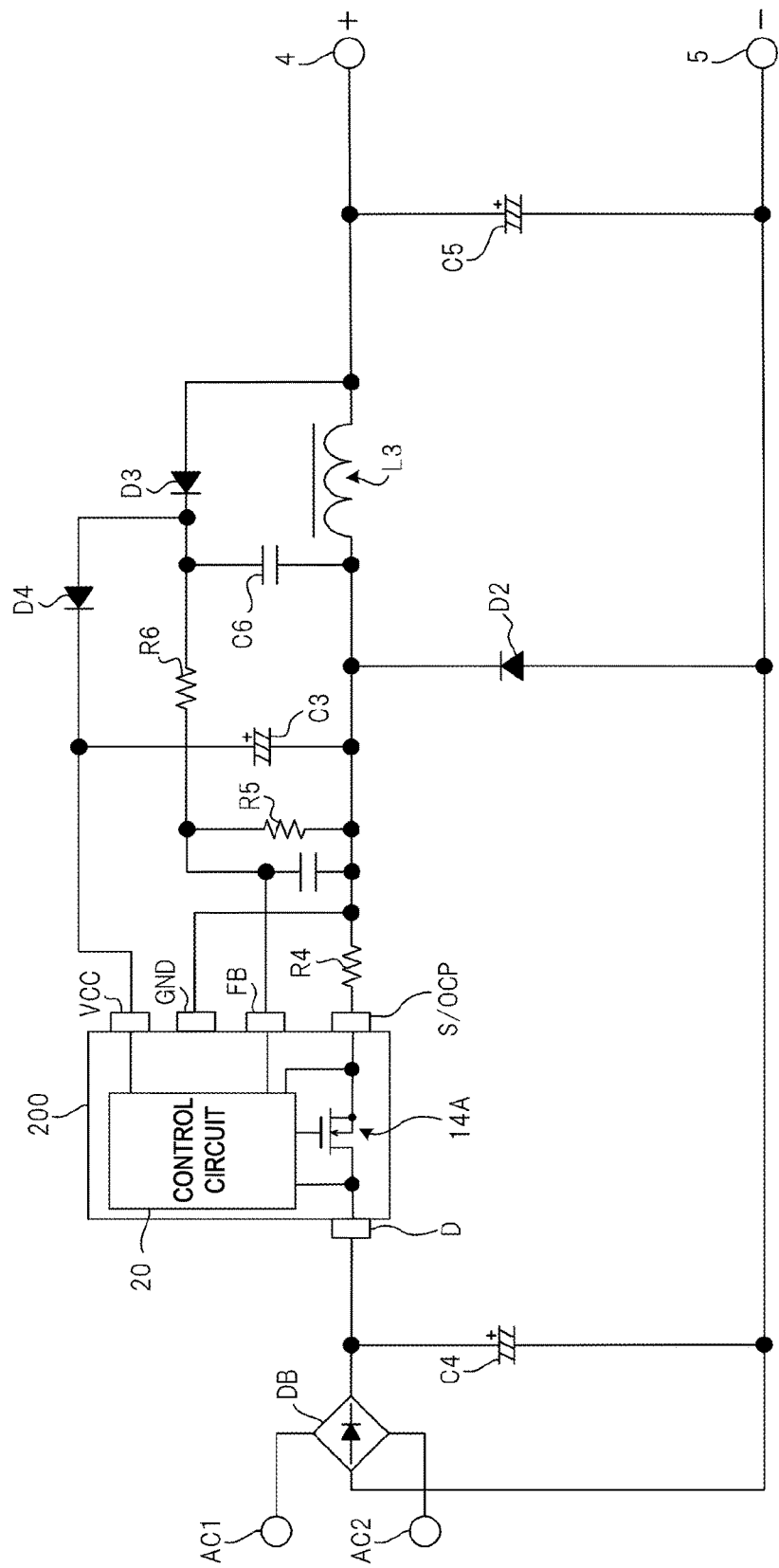
FIG. 9 illustrates another example of the configuration of the switching power-supply device.

FIG. 9 is a circuit diagram showing a configuration example of a non-insulating switching power-supply device, as the switching power-supply device of the disclosure.

The switching power-supply device shown in FIG. 9 has a direct current power source having a rectification circuit DB and a smoothing capacitor C4, a step-down chopper circuit having a switching element 14A connected to the direct current power source, an inductor L3, a diode D2 and a capacitor C5, a regenerated voltage detection circuit having a diode D3, a capacitor C6, a resistance R5 and a resistance R6 and configured to detect a regenerated voltage of the inductor L3 during an off time period of the switching element 14A, a controller IC 200 including a switching element 14 and a control circuit 20, which controls on and off of the switching element 14A so that the regenerated voltage of the inductor L3 becomes a reference voltage $V_{REF}$, on the basis of an error voltage between a regenerated voltage $V_{fb}$ detected by the regenerated voltage detection circuit and a reference voltage $V_{REF}$, an auxiliary power supply circuit having a diode D3, a diode D4 and a capacitor C3 and configured to charge the capacitor C3 by using the regenerated voltage of the inductor L3 during an off time period of the switching element 14A and to supply a voltage of the capacitor C3 to the control circuit 20, as a power supply voltage, and a current detection resistance R4. The control circuit 20 configures an integrated circuit.

A commercial alternating current power source is connected to alternating current input terminals AC1, AC2 of the rectification circuit DB in which a diode is bridged. An alternating current voltage input from the commercial alternating current power source is full wave-rectified and is output from the rectification circuit DB.

The smoothing capacitor C4 is connected between a rectified output positive terminal of the rectification circuit DB and a negative-side output terminal 5 of the switching power-supply device. Also, the rectified output negative terminal of the rectification circuit DB is connected to the negative-side output terminal 5 of the switching power-supply device. Thereby, a direct current voltage is obtained by rectifying and smoothing the alternating current voltage supplied from the commercial alternating current power source at the rectification circuit DB and the smoothing capacitor C4.

The control circuit 20 has a D terminal to which the direct current voltage rectified and smoothed at the rectification circuit DB and the smoothing capacitor C4 is input, an S/OCP terminal, a VCC (power-supply voltage input) terminal, an FB terminal, and a GND terminal.

A drain terminal of the switching element 14A is connected to the D terminal, and a source terminal of the switching element 14A is connected to the S/OCP terminal.

One end of the current detection resistance R4 is connected to the S/OCP terminal. The other end of the current detection resistance R4 is connected to the GND terminal of the controller IC 200 and to one end of the inductor L3. The other end of the inductor L3 is connected to the positive-side output terminal 4 of the switching power-supply device.

The current detection resistance R4 is a current detection circuit configured to detect the drain current flowing through the switching element 14A, as the drain current detection signal Id.

The diode D2 is connected between a connection point of the current detection resistance R4 and the inductor L3 and the negative-side output terminal 5. The capacitor CS is connected between a connection point of the inductor L3 and the positive-side output terminal 4 and the negative-side output terminal 5.

The step-down chopper circuit is configured by a series circuit of the switching element 14A, the current detection resistance R4 and the diode D2, which is connected to the direct current power source having the rectification circuit DB and the smoothing capacitor C4, and a series circuit of the inductor L3 and the capacitor C5, which is connected to both ends of the diode D2. As the configuration of the step-down chopper circuit, a well-known configuration may be used. For example, the diode D2 may be configured by the switching element.

A series circuit of the diode D3 and the capacitor C6 is connected to both ends of the inductor L3. During the off time period of the switching element 14A, the regenerated current of the inductor L3 flows through the diode D3 and is supplied to the capacitor C6.

A series circuit of the resistance R5 and the resistance R6 is connected to both ends of the capacitor C6. The FB terminal is connected to a connection point of the resistance R5 and the resistance R6. A voltage of the capacitor C6 is input, as the regenerated voltage $V_{fb}$ of the inductor L3, to the FB terminal by a resistance division of the resistance R5 and the resistance R6.

A series circuit of the diode D3, the diode D4 and the capacitor C3 is also connected to both ends of the inductor L3. During the off time period of the switching element 14A, the regenerated current of the inductor L3 flows through the diode D3 and the diode D4 and is supplied to the capacitor C3.

A connection point of the capacitor C3 and the diode D4 is connected to a VCC terminal of the controller IC 200, and a connection point of the capacitor C3 and the inductor L3 is connected to a GND terminal of the controller IC 200. Thereby, a voltage of the capacitor C3 is supplied to the control circuit 20, as a power supply voltage Vcc of the control circuit 20.

The control circuit 20 is configured to control the on and off states of the switching element 14A by the power supply voltage Vcc. The control circuit 20 performs the PWM control of controlling an on width of the switching element 14A in accordance with an error voltage between the regenerated voltage $V_{fb}$ input to the FB terminal and the reference voltage.

In the switching power-supply device, the control circuit 20 embeds the LEB circuit 15 and the continuous mode detection circuit 16 (FIG. 1) therein. The LEB circuit 15 is connected to the S/OCP terminal. Similarly to the controller IC 100, the control circuit 20 is configured to control the drive speed of the switching element 14A and to control the switching frequency of the switching element 14A, depending on whether the continuous mode is detected by the continuous mode detection circuit 16.

As described above, also in the non-insulating switching power-supply device, it is possible to reduce the switching loss during the continuous mode, like the insulating switching power-supply device shown in FIGS. 1, 5 and 7.

Although the disclosure has been described with reference to the illustrative embodiments, the illustrative embodiments are just exemplary and can be changed without departing from the gist of the disclosure.

As described above, the specification discloses followings.

A disclosed integrated circuit is an integrated circuit to be used in a switching power-supply device having an inductor and a switching element serially connected to the inductor, the integrated circuit comprising: a control circuit, which controls on and off of the switching element and performs an output voltage control in any one of a plurality of modes comprising a continuous mode and a discontinuous mode, and a continuous mode detection circuit, which detects that the output voltage control is performed in the continuous mode when a current flowing through the switching element is equal to or greater than a threshold.

In the disclosed integrated circuit, the continuous mode detection circuit detects the current flowing through the switching element at a predetermined timing.

In the disclosed integrated circuit, the predetermined timing is a timing where the switching element is switched from the off state to the on state and flowing of a surge current has completed.

In the disclosed integrated circuit, the control circuit changes a drive speed of the switching element, between a case where it is detected that the output voltage control is performed in the continuous mode and a case where it is not detected that the output voltage control is performed in the continuous mode.

In the disclosed integrated circuit, the control circuit switches the drive speed of the switching element to be a plurality of values comprising a first value and a second value greater than the first value, wherein when it is detected that the output voltage control is performed in the continuous mode, the control circuit controls the drive speed of the switching element to be the second value, and wherein when it is not detected that the output voltage control is performed in the continuous mode, the control circuit controls the drive speed of the switching element to be the first value.

In the disclosed integrated circuit, the control circuit changes the second value, which is equal to or greater than the threshold, depending on a magnitude of the current flowing through the switching element.

The disclosed integrated circuit further has a unit configured to detect an on duty of the switching element, wherein when it is detected that the output voltage control is performed in the continuous mode, the control circuit controls the drive speed of the switching element to be the first value if the on duty exceeds a predetermined value.

In the disclosed integrated circuit, the control circuit changes a switching frequency of the switching element, between a case where it is detected that the output voltage control is performed in the continuous mode and a case where it is not detected that the output voltage control is performed in the continuous mode.

In the disclosed integrated circuit, the control circuit is configured to switch the switching frequency of the switching element to a plurality of values comprising a third value and a fourth value smaller than the third value, and wherein when it is detected that the output voltage control is performed in the continuous mode, the control circuit controls the switching frequency of the switching element to be the fourth value, and wherein when it is not detected that the output voltage control is performed in the continuous mode, the control circuit controls the switching frequency of the switching element to be the third value.

In the disclosed integrated circuit, when it is detected that the output voltage control is performed in the continuous mode, the control circuit controls the switching frequency of the switching element to be the fourth value during a time period corresponding to a plurality of cycles from the point of detection time and controls the switching frequency to be the third value after the time period elapses from the point of detection time.

A disclosed switching power-supply device has the integrated circuit, the inductor, and the switching element.

The invention claimed is:

1. An integrated circuit to be used in a switching power-supply device having an inductor and a switching element serially connected to the inductor, the integrated circuit comprising:
   a control circuit, which controls on and off of the switching element and performs an output voltage control in any one of a plurality of modes comprising a continuous mode and a discontinuous mode, and
   a continuous mode detection circuit, which detects that the output voltage control is performed in the continuous mode when a current flowing through the switching element is equal to or greater than a threshold,
   wherein the control circuit changes a switching frequency of the switching element, between a case where it is detected that the output voltage control is performed in the continuous mode and a case where it is not detected that the output voltage control is performed in the continuous mode,
   wherein the control circuit is configured to switch the switching frequency of the switching element to a plurality of values comprising a first value and a second value smaller than the first value,
   wherein when it is detected that the output voltage control is performed in the continuous mode, the control circuit controls the switching frequency of the switching element to be the second value,
   wherein when it is not detected that the output voltage control is performed in the continuous mode, the control circuit controls the switching frequency of the switching element to be the first value,
   wherein the continuous mode detection circuit detects the current flowing through the switching element at a predetermined timing, and
   wherein the predetermined timing is a timing where the switching element is switched from an off state to an on state and flowing of a surge current has completed.

2. The integrated circuit according to claim 1, wherein the control circuit changes a drive speed of the switching element, between a case where it is detected that the output voltage control is performed in the continuous mode and a case where it is not detected that the output voltage control is performed in the continuous mode.

3. The integrated circuit according to claim 2,
wherein the control circuit switches the drive speed of the switching element to be a third value and a fourth value greater than the third value,
wherein when it is detected that the output voltage control is performed in the continuous mode, the control circuit controls the drive speed of the switching element to be the fourth value, and
wherein when it is not detected that the output voltage control is performed in the continuous mode, the control circuit controls the drive speed of the switching element to be the third value.

4. The integrated circuit according to claim 3, wherein the control circuit changes the fourth value, which is equal to or greater than the threshold, depending on a magnitude of the current flowing through the switching element.

5. The integrated circuit according to claim 1, wherein when it is detected that the output voltage control is performed in the continuous mode, the control circuit controls the switching frequency of the switching element to be the second value during a time period corresponding to a plurality of cycles from a point of detection and controls the switching frequency to be the first value after the time period elapses from the point of detection.

6. A switching power-supply device comprising:
an inductor;
a switching element serially connected to the inductor; and
an integrated circuit comprising:
   a control circuit, which controls on and off of the switching element and performs an output voltage control in any one of a plurality of modes comprising a continuous mode and a discontinuous mode, and
   a continuous mode detection circuit, which detects that the output voltage control is performed in the continuous mode when a current flowing through the switching element is equal to or greater than a threshold,
   wherein the control circuit changes a switching frequency of the switching element, between a case where it is detected that the output voltage control is performed in the continuous mode and a case where it is not detected that the output voltage control is performed in the continuous mode,
   wherein the control circuit is configured to switch the switching frequency of the switching element to a plurality of values comprising a first value and a second value smaller than the first value,
   wherein when it is detected that the output voltage control is performed in the continuous mode, the control circuit controls the switching frequency of the switching element to be the second value, and
   wherein when it is not detected that the output voltage control is performed in the continuous mode, the control circuit controls the switching frequency of the switching element to be the first value,
wherein the continuous mode detection circuit detects the current flowing through the switching element at a predetermined timing, and
wherein the predetermined timing is a timing where the switching element is switched from an off state to an on state and flowing of a surge current has completed.

7. An integrated circuit to be used in a switching power-supply device having an inductor and a switching element serially connected to the inductor, the integrated circuit comprising:
a control circuit, which controls on and off of the switching element and performs an output voltage control in any one of a plurality of modes comprising a continuous mode and a discontinuous mode, and
a continuous mode detection circuit, which detects that the output voltage control is performed in the continuous mode when a current flowing through the switching element is equal to or greater than a threshold,
wherein the control circuit changes a switching frequency of the switching element, between a case where it is detected that the output voltage control is performed in the continuous mode and a case where it is not detected that the output voltage control is performed in the continuous mode,
wherein the control circuit is configured to switch the switching frequency of the switching element to a plurality of values comprising a first value and a second value smaller than the first value,
wherein when it is detected that the output voltage control is performed in the continuous mode, the control circuit controls the switching frequency of the switching element to be the second value,
wherein when it is not detected that the output voltage control is performed in the continuous mode, the control circuit controls the switching frequency of the switching element to be the first value, and
wherein when it is detected that the output voltage control is performed in the continuous mode, the control circuit controls the switching frequency of the switching element to be the second value during a time period corresponding to a plurality of cycles from a point of detection and controls the switching frequency to be the first value after the time period elapses from the point of detection.

* * * * *